US012713716B2

(12) United States Patent
Itzler et al.

(10) Patent No.: US 12,713,716 B2
(45) **Date of Patent: *Aug. 18, 2026**

(54) GEIGER-MODE FOCAL PLANE ARRAY WITH MONOLITHICALLY INTEGRATED RESISTORS

(71) Applicant: LG INNOTEK CO., LTD., Seoul (KR)

(72) Inventors: Mark Allen Itzler, Princeton, NJ (US); Brian Piccione, Yardley, PA (US); Xudong Jiang, Princeton, NJ (US); Krystyna Slomkowski, Parlin, NJ (US)

(73) Assignee: LG INNOTEK CO., LTD., Seoul (KR)

(*) Notice: Subject to any disclaimer, the term of this patent is extended or adjusted under 35 U.S.C. 154(b) by 143 days.

This patent is subject to a terminal disclaimer.

(21) Appl. No.: 18/391,093

(22) Filed: Dec. 20, 2023

(65) Prior Publication Data

US 2024/0120350 A1 Apr. 11, 2024

Related U.S. Application Data

(60) Continuation of application No. 17/470,178, filed on Sep. 9, 2021, now Pat. No. 11,888,000, which is a (Continued)

(51) Int. Cl.

| | |
|---|---|
| ***H10F 30/225*** | (2025.01) |
| ***G01J 1/44*** | (2006.01) |
| ***H10F 39/10*** | (2025.01) |
| ***H10F 77/00*** | (2025.01) |
| *H01C 7/00* | (2006.01) |
| *H10F 39/00* | (2025.01) |

(52) U.S. Cl.

CPC .............. *H10F 39/107* (2025.01); *G01J 1/44* (2013.01); *H10F 30/225* (2025.01);

(Continued)

(58) Field of Classification Search

CPC ............. H01L 31/107; H01L 31/02027; H01L 27/1446; H01L 27/14609; G01J 1/44; G01J 2001/4466; G01J 2001/448; H10F 30/225

See application file for complete search history.

(56) References Cited

U.S. PATENT DOCUMENTS

| | | | | |
|---|---|---|---|---|
| 12,125,857 | B2 * | 10/2024 | Itzler | H10F 30/225 |
| 2014/0263975 | A1 * | 9/2014 | Nagano | H10F 39/1898 250/208.2 |

(Continued)

FOREIGN PATENT DOCUMENTS

| | | |
|---|---|---|
| JP | 2006-108655 A | 4/2006 |

OTHER PUBLICATIONS

Ex Parte Quayle Action Mailed on Jul. 12, 2021 for U.S. Appl. No. 16/002,816.

(Continued)

*Primary Examiner* — Nelson Garces

(74) *Attorney, Agent, or Firm* — Birch, Stewart, Kolasch & Birch, LLP

(57) ABSTRACT

An image sensing device including a Geiger-mode avalanche photodiode (GmAPD), a read out integrated circuit (ROIC), and a limit resistor connected to the GmAPD and the ROIC in series, wherein the ROIC includes an active quenching circuit.

17 Claims, 8 Drawing Sheets

Related U.S. Application Data division of application No. 16/002,816, filed on Jun. 7, 2018, now Pat. No. 11,233,076.

(60) Provisional application No. 62/516,453, filed on Jun. 7, 2017.

(52) U.S. Cl.
CPC .... *H10F 77/959* (2025.01); *G01J 2001/4466* (2013.01); *G01J 2001/448* (2013.01); *H01C 7/006* (2013.01); *H10F 39/803* (2025.01)

(56) References Cited

U.S. PATENT DOCUMENTS

| | | | |
|---|---|---|---|
| 2018/0269236 | A1 | 9/2018 | Sasaki |
| 2019/0172965 | A1 | 6/2019 | Ishida et al. |
| 2020/0183511 | A1 | 6/2020 | Frescas et al. |

OTHER PUBLICATIONS

Final Rejection Mailed Jan. 27, 2021 for U.S. Appl. No. 16/002,816.

Franco Zappa, Massimo Ghioni, Sergio Cova, Carlo Samori, Andrea Carlo Giudice, An Integrated Active-Quenching Circuit for Single-Photon Avalanche Diodes, Dec. 2000, IEEE Transactions on Instrumentation and Measurement, vol. 49, No. 6, p. 1167-1175 (Year: 2000).

Non-Final Rejection Mailed on Sep. 24, 2020 for U.S. Appl. No. 16/002,816.

Requirement for Restriction/Election Mailed on May 20, 2020 for U.S. Appl. No. 16/002,816.

Requirement for Restriction/Election received for U.S. Appl. No. 16/002,816, mailed on Nov. 12, 2019, 8 pages.

Ronald H. Haitz, "Model for the Electrical Behavior of a Microplasma", "Journal of Applied Physics", Jul. 20, 2004, Abstract Only, vol. 35, Iss. 5, https://doi.org/10.1063/1.1713636.

* cited by examiner

FIG. 1
Prior
Art $V_{HI}$
Voltage
$V_Q$
$V_{LO}$
$t_0$
Time $I_A$
Current
$I_0$
0
$t_0$
Time 628
APD Device Layers 622
Active Region
624
626
Substrate 620

Passivation
Layer 626
628

632
630
628
APD Device Layers 622
Active Region
624
626
Substrate 620

Bond Pad
632
628
Limit Resistor 630
Passivation
Layer 626

636
632
634
628
634
634
APD Device Layers 622
Active Region
624
626

Substrate 620

Insulation layer 634
Bond Pad
632
630
Insulation layer 634

Bond Pad
632
730
Passivation
Layer 626

GEIGER-MODE FOCAL PLANE ARRAY WITH MONOLITHICALLY INTEGRATED RESISTORS

CROSS REFERENCE TO RELATED APPLICATIONS

This application is a continuation of U.S. application Ser. No. 17/470,178, filed Sep. 9, 2021, which is a divisional of U.S. application Ser. No. 16/002,816, filed Jun. 7, 2018, patented on Jan. 25, 2022 as U.S. Pat. No. 11,233,076, which claims the benefit of U.S. Provisional Application No. 62/516,453, filed Jun. 7, 2017, all of which are hereby expressly incorporated by reference in their entirety into the present application.

FIELD OF THE INVENTION

This invention relates generally to Geiger-mode (Gm) avalanche photodiode (APD) focal plane arrays (FPAs) and, more particularly, to architectures and methods for increasing the optical overstress tolerance thereof.

BACKGROUND OF THE INVENTION

There is a potential for saturation or loss of functionality in GmAPD FPAs due to incoming high-intensity optical signals. These high-intensity signals can generate, in the GmAPD, excessively large currents, which are then injected into the read-out integrated circuit (ROIC). These large currents may result in corruption of data from the FPA or possibly result in damage to the sensor. It is desirable to avoid these effects, collectively referred to as "optical overstress," through elements of the FPA design.

FIG. 1 depicts a circuit model for pixel 100 of a prior-art GmAPD FPA. In the context of a photodiode FPA, such as a GmAPD FPA, the term "pixel" collectively references (i) a single photodiode in the array thereof and (ii) a unit cell of the read-out integrated circuit, at a minimum. Thus, pixel 100 includes GmAPD 102 (of an array thereof referred to as a photodiode array or "PDA") and ROIC unit cell 108.

The circuit model of the GmAPD 102 includes intrinsic instantaneous series resistance "$R_S(t)$," breakdown voltage "$V_B$," diode capacitance "$C_D$," and switch "S" to emulate the spontaneous avalanche breakdown process in the GmAPD. See, Haitz, R. H. "Model for the Electrical Behavior of a Microplasma" J. Appl. Phys. 35, 1370 (1964). ROIC unit cell 108 includes arm transistor 110, disarm transistor 112, and sense transistor 114.

GmAPD 102 is armed by externally applied voltage "$V_{HI}$," with accompanying low-impedance load resistance $R_L$. Voltage $V_{HI}$ is set as follows:

$$V_{HI}=V_B+\text{excess bias } V_{EX} \quad (1)$$

where: $V_{EX}<5$ volts

The source of the excess bias is disconnected after a user-defined "arm" time.

Referring now to FIGS. 2A and 2B, detection of an optical signal, and its corresponding avalanche, at time $t=t_0$, corresponds to the closing of switch S. At this time, voltage V between nodes 104 and 106 in FIG. 1 begins dropping from $V_{HI}$ and current/begins increasing to $I_A$:

$$I_A=((V_{HI}-V_B)/R_S(t)) \quad (2)$$

When sense transistor 114 in ROIC unit cell 108 detects that the voltage has dropped to quench voltage $V_Q$, disarm transistor 112 turns "on," reducing the voltage across GmAPD 102 to $V_{LO}$, as depicted in FIG. 2A, where:

$$V_{LO}=V_{HI}-5\text{ volts} \quad (3)$$

As the voltage is reduced below breakdown voltage $V_B$, switch S opens again and the current drops from steady-state value $I_0$ back to zero, as depicted in FIG. 2B. At this point, GmAPD 102 can be re-armed with arm transistor 110 after a user-defined hold-off time. This approach, called "active quenching," enables much greater control over the functionality of a GmAPD in comparison with a "passive quenching" scheme, in which the disarming and re-arming occur automatically in accordance with behavior set by a single "quench" resistor in place of ROIC unit cell 108.

The initial spike in current I to $I_A$ scales with optical intensity in the presence of a very large optical signal due to $R_s(t)$ decreasing when an excess of free carriers are generated within the diode. High magnitudes of this peak current ultimately cause the issues attributed to "optical overstress" upon injection into ROIC unit cell 108. As this problem is relatively unique to GmAPD FPAs due to the high impedance necessary at the ROIC input for detection of avalanche events, to the inventors' knowledge, it has not been addressed in the prior art.

SUMMARY OF THE INVENTION

Embodiments of the invention provide a way to significantly increase the tolerance of a GmAPD FPA to optical overstress.

A first approach adopted by the present inventors to address the problem of high peak current was to shut down the power supply lines in the ROIC when high current is detected. This approach proved to be ineffective, however, due to the essentially instantaneous overstress impact of the current pulse (i.e. <<10 nanoseconds). The inventors then considered a second approach wherein the magnitude of the current is reduced before the current is injected into ROIC unit cell 108.

In accordance with the illustrative embodiment, one or more limit resistor(s) are monolithically integrated within each pixel of the GmAPD FPA. The inventors recognized that, based on certain considerations related to the architecture of their GmAPD arrays, the limit resistor(s) must be monolithically integrated. In some of such embodiments, the limit resistor(s) are integrated into the GmAPD of each pixel. In some other of such embodiments, the limit resistor(s) are integrated into the ROIC unit cell of each pixel. In some further embodiments, limit resistor(s) are integrated into both the GmAPD and the ROIC unit cell of each pixel.

As a consequence of the presence of the limit resistor(s) in accordance with the present teachings, when the switch S closes at time $t_0$, the voltage V drops more slowly than in the prior art (as depicted in FIG. 2A). Current still flows to the ROIC unit cell, but the total charge that is injected therein is discharged at more gradually, thereby reducing the peak current magnitude as compared to the prior art (as depicted in FIG. 2B). A further benefit of the embodiments of the invention over the initially attempted "shut-down" approach is that high-intensity input signals can still be detected and analyzed.

Some embodiments of the invention provide a GmAPD FPA comprising a plurality of pixels, each pixel comprising: an electrical circuit including a GmAPD, a unit cell of a ROIC, and a limit resistor, wherein the limit resistor is monolithically integrated in the pixel, and wherein the limit resistor limits a magnitude of a current entering the ROIC unit cell, wherein the current is generated by the GmAPD.

Some embodiments of the invention provide a GmAPD FPA comprising a plurality of pixels, each pixel comprising: a GmAPD having a limit resistor monolithically integrated therein, the limit resistor operable to limit a magnitude of a current generated by the GmAPD, and a unit cell of a ROIC that receives the current, as limited by the limit resistor, from the GmAPD.

Some embodiments of the invention provide a method for increasing the tolerance of a GmAPD FPA to optical overstress, the method comprising increasing, within each pixel of the GmAPD FPA, the series resistance of an electrical connection between the GmAPD and a unit cell of a ROIC.

BRIEF DESCRIPTION OF THE DRAWINGS

FIG. 1 depicts an electrical circuit model of a prior-art GmAPD FPA pixel.

DETAILED DESCRIPTION

Embodiments of the invention provide a GmAPD FPA having increased tolerance optical overstress. For the sake of clarity, the embodiments of the invention are depicted and described at the pixel level. Each GmAPD FPA pixel includes a GmAPD pixel and a unit cell of an ROIC. There is a 1:1 relationship between GmAPDs and unit cells of the ROIC. Each unit cell of the ROIC provides a digital readout of the avalanche events that occur within the associated GmAPD. It is within the capabilities of those skilled in the art to appropriately scale to the level of a GmAPD FPA.

Figure 2A:
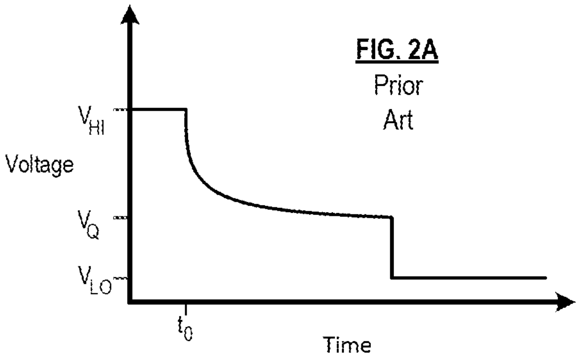
FIG. 2A depicts the voltage-vs-time behavior of the pixel of FIG. 1 following an avalanche event.
Figure 2B:
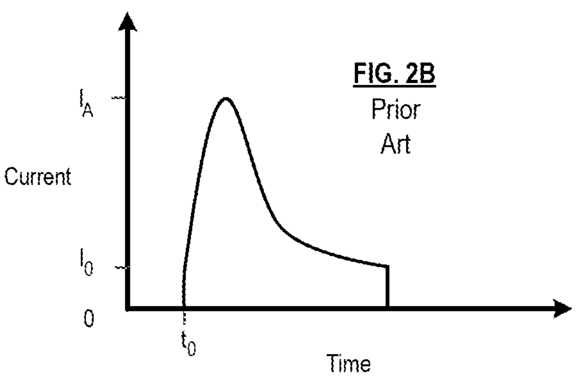
FIG. 2B depicts the current-vs-time behavior of the pixel of FIG. 1 following an avalanche event.
Figure 3A:
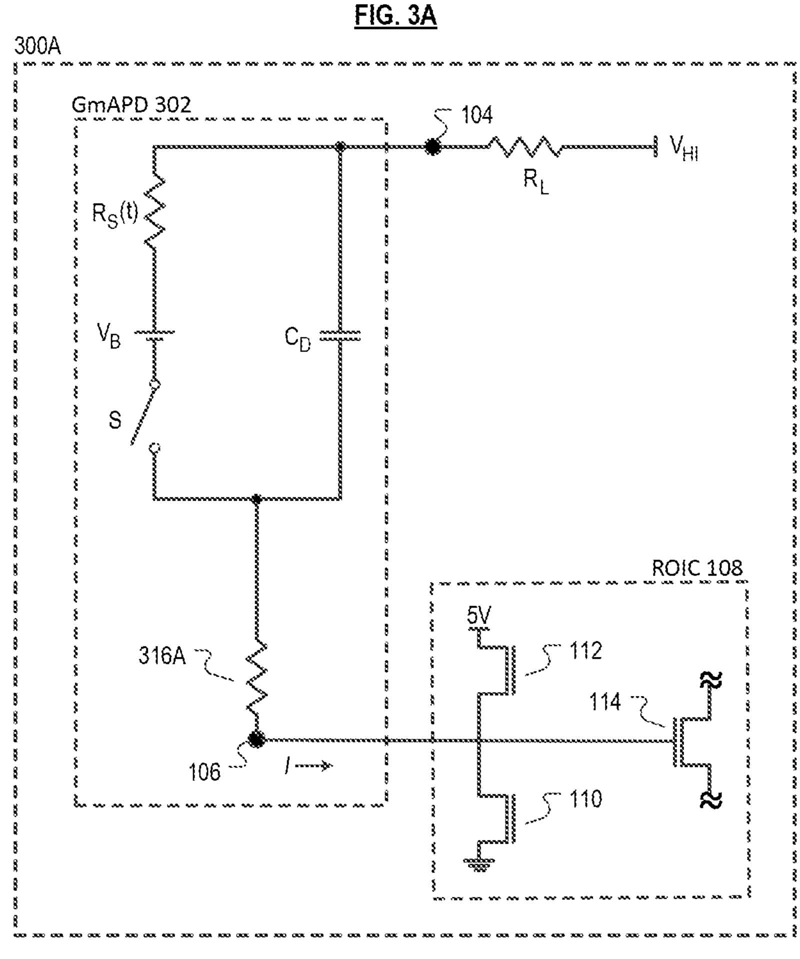
FIG. 3A depicts an electrical circuit model of a GmAPD FPA pixel in accordance with a first embodiment of the present invention.

FIG. 3A depicts a circuit model of GmAPD FPA pixel 300A, in accordance with an embodiment of the present invention. GmAPD FPA pixel 300A differs from prior-art GmAPD FPA pixel 100 in that the former includes limit resistor 316A. In this embodiment, limit resistor 316A is monolithically integrated into GmAPD 302 (as opposed to the ROIC unit cell). In an embodiment of a GmAPD FPA based on FIG. 3A, which will include a 2D array of pixels like that depicted in FIG. 3A, each such pixel will include limit resistor 316A that has been monolithically integrated within the GmAPD of the pixel.

In some embodiments in which limit resistor 316A is monolithically integrated in GmAPD 302, the limit resistor is a thin-film resistor that is patterned on the GmAPD from, for example, standard-production, high-resistivity NiCr and TaN thin films.

Figure 3B:
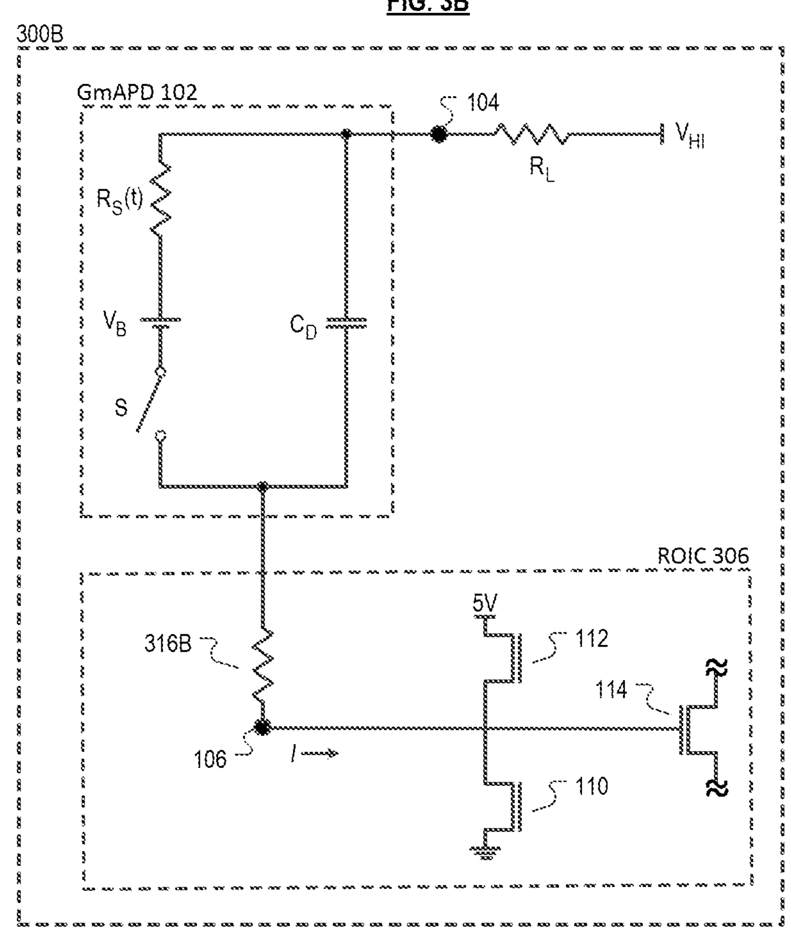
FIG. 3B depicts an electrical circuit model of a GmAPD FPA pixel in accordance with a second embodiment of the present invention.

FIG. 3B depicts a circuit model of GmAPD FPA pixel 300B, in accordance with an embodiment of the present invention. Like GmAPD FPA pixel 300A, GmAPD FPA pixel 300B differs from prior-art GmAPD FPA pixel 100 in that pixel 300B includes limit resistor 316B. In this embodiment, however, limit resistor 316B is monolithically integrated into ROIC unit cell 306.

Thus, in both embodiments depicted, the limit resistor is: (a) located in the circuit between the GmAPD and the ROIC unit cell, and (b) monolithically integrated into the GmAPD FPA pixel.

Figure 1:
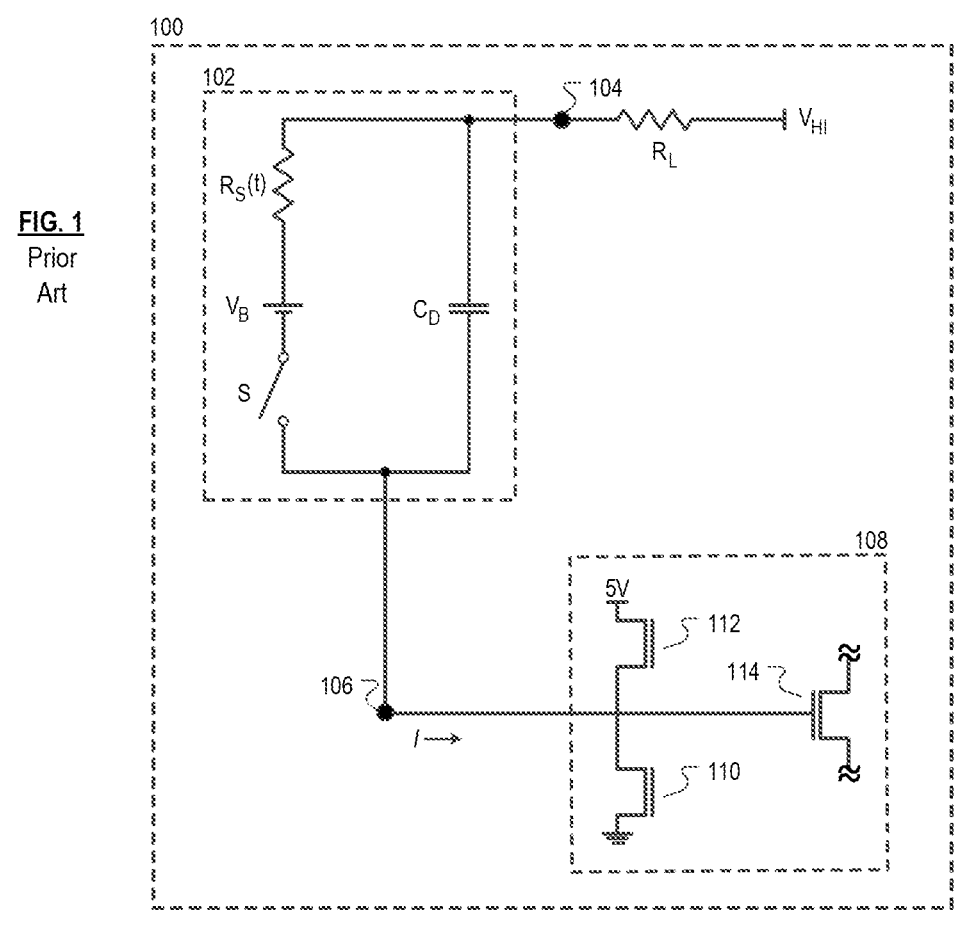
Figure 4A:
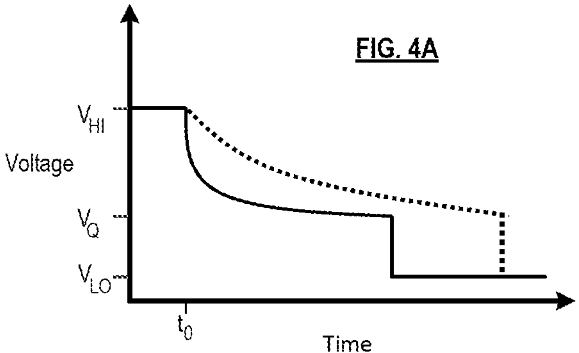
FIG. 4A depicts a comparison of the voltage-vs-time behavior of the GmAPD FPA pixel of FIG. 1 and a GmAPD FPA pixel in accordance with the present teachings, following an avalanche event.
Figure 4B:
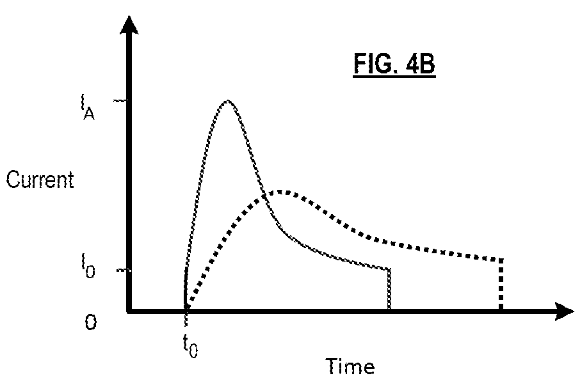
FIG. 4B depicts a comparison of the current-vs-time behavior of the GmAPD FPA pixel of FIG. 1 and a GmAPD FPA pixel in accordance with the present teachings, following an avalanche event.

FIGS. 4A and 4B depict a comparison of the electrical behavior of a prior-art GmAPD FPA pixel (see FIG. 1) and a GmAPD FPA pixel in accordance with the present teachings (e.g., see FIGS. 3A, 3B).

With reference to FIGS. 1, 3A, 3*b*, and 4A, upon closing of switch S at time $t_0$, the voltage V in a GmAPD FPA pixel in accordance with the present invention (dashed line) drops more slowly than a GmAPD FPA pixel of the prior art (solid line). As depicted in FIG. 4B, current I still flows to the ROIC, but the total charge injected into the ROIC (which is the area under each curve in FIG. 4B) is discharged at a more gradual pace, thereby reducing the peak current magnitude as compared to the prior art.

Because sense transistor 114 in the ROIC unit cell is a voltage threshold detector, the smaller current amplitudes generated in embodiments of the invention will not degrade the circuit's ability to detect avalanches. The primary performance trade-off to be considered is avoiding degradation of the FPA timing jitter performance associated with an increase in avalanche RC time constants induced by the presence of limit resistor 316A or 316B. This places an upper limit on useful values of the limit resistor of about 100 kOhms. The lower limit of resistance of the limit resistor, which is about 1 kOhm, is determined by the minimum value that reduces the peak current to an acceptable value.

Since the existing series resistance between the GmAPD anode and the ROIC input in an APD FPA is dominated by the contact resistance of the APD anode contact, which is about 100 ohms, the aforementioned resistance range of the limit resistor (i.e., about 1 kOhm to about 100 kOhms) is expected to yield, at minimum, a factor-of-ten improvement in optical-overload tolerance. At the same time, keeping the resistance in the aforementioned range will, as previously noted, avoid unacceptable levels of degradation in timing jitter performance.

As previously noted, in embodiments of the invention, the limit resistor is monolithically integrated into the GmAPD FPA pixel. A process for monolithically integrating the limit resistor into a GmAPD, such as to form GmAPD 301 (FIG. 3A), is disclosed in FIGS. 5 and 6A-6F and the accompanying description.

The fabrication operations germane to embodiments of the invention take place after epitaxial growth of the various layers (e.g., absorption layer, charge control layer, cap layer, etc.) composing an APD (hereinafter referred to in the disclosure and claims as the "APD device layers"), but before diffusing a dopant into the cap layer to form the active region of the APD. Conventional techniques are used for metal deposition, insulator deposition, patterning, etc.

Figure 5:
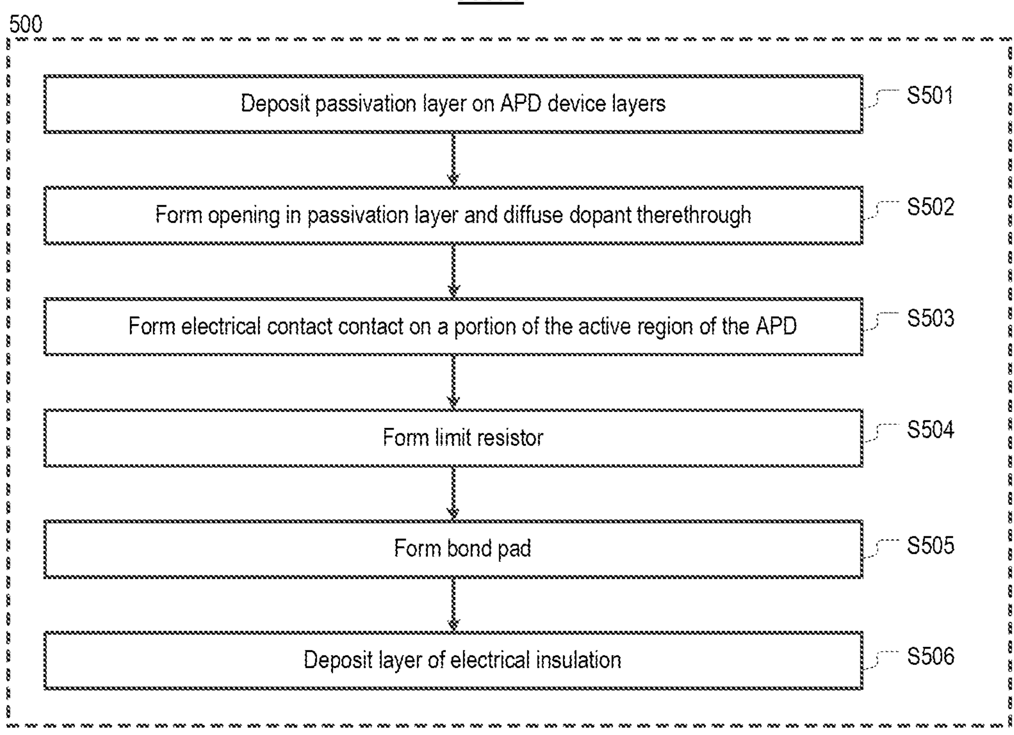
FIG. 5 depicts a flow diagram of method for fabricating a GmAPD PDA pixel in accordance with the illustrative embodiment.

Referring now to FIG. 5, in operation S501 of method 500, a layer providing electrical passivation (and also electrical insulation), referred to herein and the appended claims as a "passivation layer," is deposited on the APD device layers. The passivation layer comprises, for example and without limitation, $SiN_x$, $Al_2O_3$, and $SiO_2$. In operation S502, an opening is patterned in the passivation layer and dopant is diffused through the opening, via standard techniques (photolithography/reactive ion etching, wet-etching, ion milling, sputtering, laser-assisted etching, etc.). It is within the capabilities of those skilled in the art to determine the size of the opening. If the material being doped is n-type semiconductor, the dopant will be a p-type dopant, such as zinc, cadmium, beryllium, and carbon. If the semiconductor layer is a p-type material, then the dopant will be an n-type dopant, such as sulfur or silicon. It is within the capabilities of those skilled in the art to appropriately dope the cap layer to provide an active region in the APD.

In operation S503, an n- or p-contact metal (dependent on device type) is deposited on a portion of the active region. As needed, additional "passivation" material is deposited to fill what remains of the opening formed in the passivation layer.

Figures 6A, 6B, 6C, 6D:
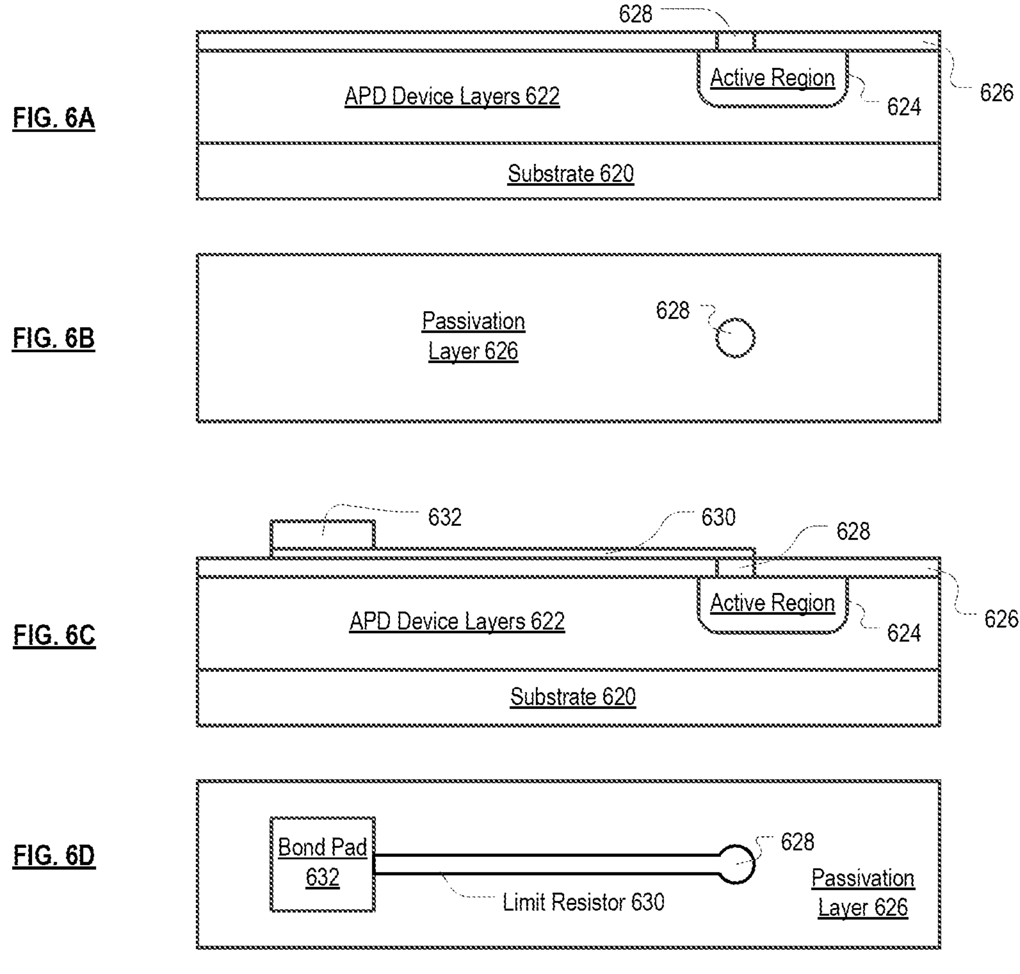
FIGS. 6A, 6C, and 6E depict cross-sectional views of a GmAPD PDA pixel in various stages of fabrication, in accordance with the illustrative embodiment.
FIGS. 6B, 6D, and 6F depict top views of a GmAPD PDA pixel in various stages of fabrication, in accordance with the illustrative embodiment.

FIGS. 6A and 6B depict respective cross-sectional and top views of a nascent GmAPD at the completion of operation S503. At this point in the fabrication, the GmAPD includes substrate 620, APD device layers 622, active region 624, passivation layer 626, and contact 628.

In operation S504, a layer of metal, such as, without limitation, high resistivity NiCr or TaN, is deposited between the contact (i.e., contact 628) and a region in which a bond pad will be deposited. This layer of metal can be deposited, for example, via electron beam evaporation, or sputtering, and be patterned into a desired configuration using techniques known in the art. This layer of metal serves as the limit resistor.

In operation S505, additional metal is deposited in a location at which a bond pad is desired. This metal will partially (or wholly) overlap the metal serving as the limit resistor. The bond pad comprises, for example and without limitation, gold, aluminum, copper, and alloys thereof.

FIGS. 6C and 6D depict respective cross-sectional and top views of the nascent GmAPD at the completion of operation S505. At this stage of completion, the GmAPD includes limit resistor 630 and bond pad 632, in addition to substrate 620, APD device layers 622, active region 624, passivation layer 626, and contact 628.

In operation S506, a layer of electrical insulation is deposited over the APD. Materials suitable for use as the layer of electrical insulation include, for example and without limitation, BCB, $SiO_2$, $SiN_x$, and $Al_2O_3$. An opening is then formed around the bond pad to enable electrical contact between the GmAPD and the ROIC.

Figures 6E, 6F, 7:
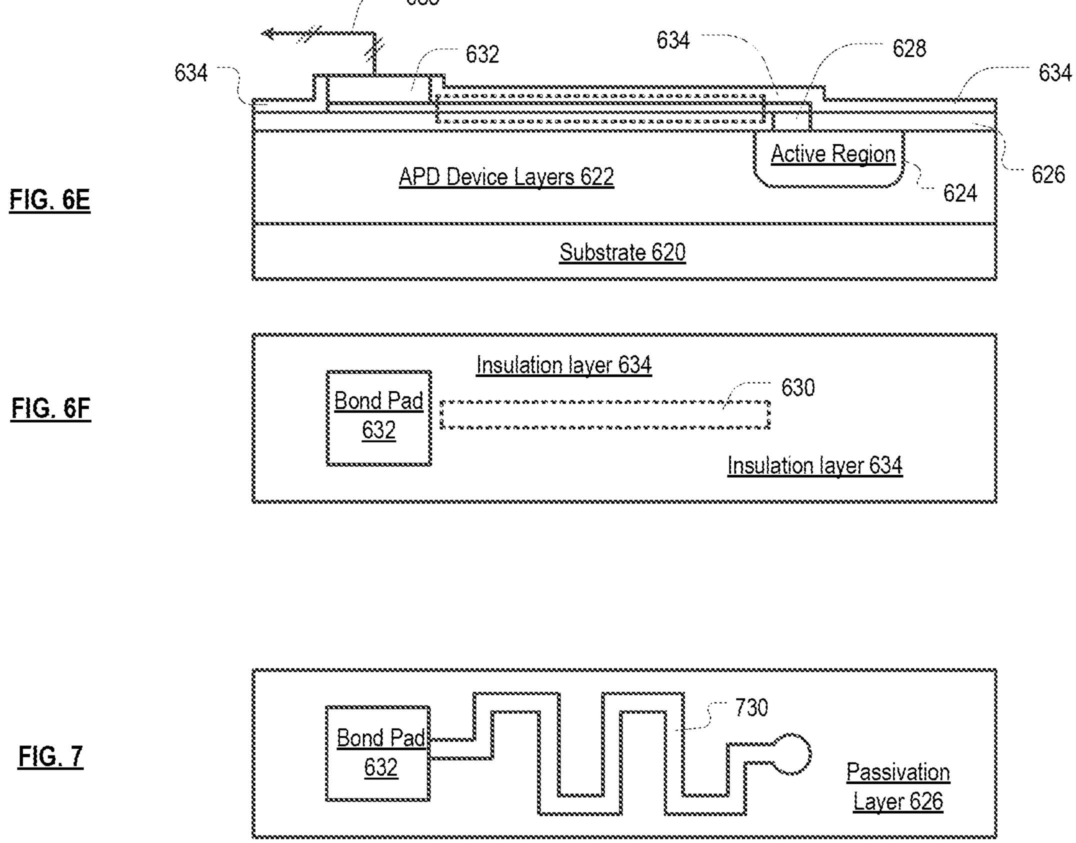
FIG. 7 depicts a top view of a GmAPD FPA pixel at a stage of fabrication, and showing an alternative layout of a limit resistor.

FIGS. 6E and 6F depict respective cross-sectional and top views of the GmAPD at the completion of operation S506, at which point the GmAPD, as modified to include the limit resistor, is complete. The GmAPD includes insulation layer 634, in addition to substrate 620, APD device layers 622, active region 624, passivation layer 626, and contact 628, limit resistor 630 and bond pad 632. Also depicted is electrical connection 636 from bond pad 632 to the ROIC.

FIG. 7 depicts resistor 730 having a serpentine shape, which is an alternative embodiment of limit resistor 630. Limit resistor 730 includes a greater number of resistor "squares" between the active region (i.e., active region 624) and bond pad 632, and thus presents greater electrical resistance. The excess of space available on the surface of the PDA is what enables the incorporation of additional resistor squares into the limit resistor. This approach, whereby additional resistor squares are added resulting in a serpentine (or other) shape, enables tuning the resistance of the limit resistor.

Monolithically integrating a limit resistor into an ROIC will necessarily proceed along a somewhat different path as a consequence of the structural differences between a GmAPD and a ROIC. In light of the present teachings, those skilled in the art will be able to adapt ROIC fabrication procedures to incorporate a limit resistor.

It is to be understood that the disclosure teaches just one example of the illustrative embodiment and that many variations of the invention can easily be devised by those skilled in the art after reading this disclosure and that the scope of the present invention is to be determined by the following claims.

What is claimed:

1. An image sensing device comprising: a Geiger-mode avalanche photodiode (GmAPD);
a read out integrated circuit (ROIC); and
a limit resistor connected to the GmAPD and the ROIC in series,
wherein the ROIC includes an active quenching circuit.

2. The device of claim 1, wherein the GmAPD, the ROIC and the limit resistor compose one pixel, and
wherein the limit resistor is integrated in one pixel.

3. The device of claim 2, wherein the limit resistor is coupled between the GmAPD and the ROIC within one pixel.

4. The device of claim 1, wherein the limit resistor is configured to limit a magnitude of a GmAPD avalanche current before entering the ROIC.

5. The device of claim 2, wherein the limit resistor is monolithically integrated with the GmAPD of one pixel.

6. The device of claim 2, wherein the limit resistor is monolithically integrated with the ROIC of one pixel.

7. The device of claim 1, wherein the limit resistor is a thin-film resistor.

8. The device of claim 1, wherein the limit resistor comprises materials selected from the group consisting of NiCr and TaN.

9. The device of claim 1, wherein the limit resistor has a resistance in the range of about 1 kOhm to about 100 kOhms.

10. The device of claim 1, wherein the GmAPD comprises:
an active region formed within APD device layers;
a passivation layer disposed on the APD device layers;
an electrical contact formed on a portion of the active region;
the limit resistor, wherein the limit resistor is disposed on the passivation layer and is in electrical communication with the electrical contact; and
a bond pad formed on at least a portion of the limit resistor.

11. The device of claim 10, wherein the limit resistor has a serpentine shape, and
wherein the serpentine shape comprises a predetermined number of resistor squares between the active region and the bond pad.

12. The device of claim 11, wherein the predetermined number of resistor squares corresponds to a desired tunable resistance of the limit resistor.

13. The device of claim 1, wherein the active quenching circuit comprises:

a sense transistor configured to receive the avalanche current from the limit resistor;

an arm transistor; and a disarm transistor, and wherein the sense, arm, and disarm transistors are configured to provide active-quenching functionality for the GmAPD.

14. The device of claim 13, wherein the limit resistor is electrically coupled between an electrical contact of the GmAPD and an input of the sense transistor in the active quenching circuit within the ROIC.

15. The device of claim 13, wherein the active quenching circuit is configured to, in response to detecting an avalanche current, turn on the disarm transistor to reduce a voltage drop across the GmAPD.

16. The device of claim 15, wherein the active quenching circuit is further configured to:

detect a level of the voltage drop across the GmAPD falling to a level below a predetermined threshold voltage, and in response to detecting the voltage drop across the GmAPD, turn on the arm transistor to re-arm the GmAPD.

17. The device of claim 16, wherein the predetermine threshold voltage corresponds to the breakdown voltage of the GmAPD.

* * * * *